United States Patent [19]

Lo

[11] Patent Number: 5,543,735
[45] Date of Patent: Aug. 6, 1996

[54] METHOD OF CONTROLLING SIGNAL TRANSFER BETWEEN SELF-RESETTING LOGIC CIRCUITS

[75] Inventor: Tin-chee Lo, Fishkill, N.Y.

[73] Assignee: International Business Machines Corporation, Armonk, N.Y.

[21] Appl. No.: 458,371

[22] Filed: Jun. 2, 1995

Related U.S. Application Data

[62] Division of Ser. No. 292,673, Aug. 18, 1994, Pat. No. 5,488,319.

[51] Int. Cl.$^6$ ............................................. H03K 19/096
[52] U.S. Cl. ............................. 326/93; 326/97; 326/98; 327/141
[58] Field of Search ................................. 326/62, 93, 94, 326/95, 96, 97, 98; 327/124, 141, 142, 145, 392, 398

[56] References Cited

U.S. PATENT DOCUMENTS

| | | | |
|---|---|---|---|
| 4,580,137 | 4/1986 | Fiedler et al. | 326/93 |
| 4,614,883 | 9/1986 | Sood et al. | 326/98 |
| 4,751,407 | 6/1988 | Powell | 326/121 |
| 4,940,904 | 7/1990 | Lin | 327/142 |
| 4,945,264 | 7/1990 | Lee et al. | 327/141 |
| 4,961,013 | 10/1990 | Obermeyer, Jr. et al. | 327/153 |
| 5,015,881 | 5/1991 | Chappell et al. | 326/108 |
| 5,015,882 | 5/1991 | Houston et al. | 326/98 |
| 5,019,724 | 5/1991 | McClure | 326/29 |
| 5,121,003 | 6/1992 | Williams | 326/96 |
| 5,127,008 | 6/1992 | Bassett et al. | 371/22.3 |
| 5,172,397 | 12/1992 | Llewellyn | 327/141 |
| 5,265,064 | 11/1993 | Davies et al. | 327/141 |
| 5,272,397 | 12/1993 | Chen et al. | 326/97 |
| 5,291,076 | 3/1994 | Bridges et al. | 326/95 |
| 5,329,176 | 7/1994 | Miller, Jr. et al. | 326/97 |
| 5,414,305 | 5/1995 | Nakamura et al. | 326/62 |
| 5,420,467 | 5/1995 | Huott et al. | 327/124 |

Primary Examiner—Edward P. Westin
Assistant Examiner—Benjamin D. Driscoll
Attorney, Agent, or Firm—Lynn L. Augspurger; Peter Visserman

[57] ABSTRACT

A latch, connected between an input self-reset dynamic MOS logic circuit and an output self-reset dynamic MOS logic circuit, is provided with clocked interface circuitry to assure proper latching of the state of the input logic in the latch and provides a pulsed output to the output logic circuit. Circuitry is provided to control the self-reset operation of the input logic circuit such that the reset does not occur until a predetermined period of time after the leading edge of the clock pulse latching the state of the input self-reset circuit in the latch. The output of the latch is gated from the latch to the output self-reset circuit under the control of a chopper circuit. The chopper circuit provides a control pulse to gate the state of the latch to the output self-reset circuit a predetermined period of time after the data has been latched. The control pulse has a duration sufficient to assure that the state of the latch is registered in the output self-reset logic.

2 Claims, 5 Drawing Sheets

METHOD OF CONTROLLING SIGNAL TRANSFER BETWEEN SELF-RESETTING LOGIC CIRCUITS

This is a division of application Ser. No. 08/292,673 filed Aug. 18, 1994, now U.S. Pat. No. 5,488,319.

BACKGROUND OF THE INVENTION

1. Field of the Invention

The invention relates to latch design in sequential logic and more particularly to timed interface circuitry between self-reset logic circuits and a latch.

2. Background Art

In high speed CMOS design, it is desirable to use NMOS devices to perform logic and to use PMOS devices as loads to achieve zero standby power. In dynamic MOS logic, the internal node of a logic tree is first precharged to a power supply voltage and then selectively discharged according to the states of the inputs to the logic circuitry. Because the precharge action for all the gates within a chip usually takes place at the same time, precharge surge current tends to be very high. Self-reset dynamic MOS logic solves this problem by asynchronously resetting the various logic trees, thereby distributing the precharge actions for a number of logic trees over time. A dynamic CMOS logic tree will typically have a plurality of inputs and a number of NMOS gates for logically combining the inputs to produce an output. A typical dynamic CMOS self-reset logic circuit, such as circuit 100 Shown in FIG. 1, comprises a well known Differential Cascode Voltage Switch (DCVS) logic tree 101 having a plurality of input terminals and internal nodes x and x-bar, as depicted in FIG. 1. In FIG. 1 and other figures depicting MOS circuit elements, the logic gates are assumed to be NFET gates unless designated by P. Those designated by P are PFET gates. The output nodes x and x-bar are precharged by load pull-up circuits 103 and 105, respectively, which are PMOS devices that charge the respective nodes. The nodes remain charged to a high voltage and are selectively discharged through the gates of the logic tree 101 in response to inputs to the logic tree. The internal nodes x, x-bar are both at a high logic value when charged. To ensure that the logic tree of the subsequently connected circuits does not erroneously receive high logic signals, the internal nodes x and x-bar are connected to inverters 107 and 109, respectively, to provide low outputs q and q-bar during the precharge state. A reset circuit 110 is connected to the output terminals q and q-bar through OR gate 112. The output of the OR gate 112 is low when the logic tree is inactive, i.e. when the internal nodes x and x-bar are charged to the positive level and outputs q and q-bar are low. When either of the outputs q and q-bar is switched to a high logic value, the output of OR gate 112, which will be a high going logic signal, is passed through an odd number of serially connected inverters 115 to produce a time delay. The output of the last of the inverters 115 is connected to both of the charging circuits 103 and 105 which again charge the internal nodes x and x-bar. The delay introduced by the inverters 115 is adjusted such that any circuit connected to the terminals q and q-bar will have sufficient time to evaluate the states of those terminals before internal nodes are again charged and the outputs q and q-bar are returned to the quiescent low state.

The self-reset logic circuit 100 may have inputs connected to an input latch and receiving input data from the input latch. Similarly, its outputs q and q-bar may be connected to an output latch for receiving output data. FIG. 2 is a representation of a prior art dual stage shift register latch (SRL) 120. The latch 120 is a CMOS Differential Cascode Voltage Switch (DCVS) implementation. The SRL shown in FIG. 2 has a first stage 121 and a second stage 131. The first state 121 has a pair of input gates 124 connected to the q and q-bar output terminals of self-reset logic 140. These gates are connected to a control gate 125 which is operated periodically under the control of a clock pulse, C, causing the state of the output q and q-bar of the first stage 121 to be activated in accordance with the states of the outputs q and q-bar of the self-reset logic 140. Three non-overlapping clock pulses and their complements A and A-bar, B and B-bar, and C and C-bar are used. These pulses are generated by well-known clock circuitry not shown in the drawing. A latching circuit 126 is operated via control gate 128, in response to the low value of the C-clock pulse to latch the states of q and q-bar at the output of the first stage 121. The outputs q and q-bar of the first stage 121 are connected to a pair of input gates 135 of the second stage 131. The gates 135 are activated by means of control gate 136 in response to clock pulse B, referred to as the launch clock, to generate appropriate outputs s and s-bar of the second stage 131. The second stage 131 further includes a pair of gates 137 activated by control gate 138 which is, in turn, activated in the absence of the clock pulse B and serves to latch the state of s and s-bar. The outputs s and s-bar are connected to self-reset logic 150. Pull-up circuits 123 and 133 are provided to charge their respective associated logic circuits. Gate 139 inhibits activation of the second stage circuitry until clock pulse C is low. Under test operation, the first stage 121 and second stage 131 are chained electrically through a scan-in port 142 and a scan-out port 143. In normal system mode operations clocks B and C are active, generating pulses in alternate time slots, and clock A is inactive. In the test mode clocks A and B are operative, generating pulses in alternate time slots, and clock C is inactive. A pair of test input gates 127, operated under control of control gate 129, are provided to receive signal from scan-in port 142. Control gate 129 is operated under control of clock A. Gate 130 serves to latch a test signal in latch 126.

A problem with the prior art design in which self-reset logic is connected to a shift register latch, such as latch 120 shown in FIG. 2, is that the clock that strobes data into the latch does not operate in synchronism with the output pulse from the self-reset logic 140 and, hence, may be unable to capture data from the self-reset logic on a timely basis. A possible solution to that problem is to extend the delay in the reset loop of the self-reset logic (FIG. 1). However, that introduces undesirable time-delay. A further problem occurs when a self-reset logic circuit, such as circuit 150, is driven by the outputs s and s-bar of the shift register latch 120. The outputs of the shift register latch are essentially steady state levels while the self-reset logic requires pulses as its input. Accordingly, a timing incompatibility has occurred which can cause circuit errors.

SUMMARY OF INVENTION

These and other problems of the prior art are solved in accordance with this invention at the interface between the output dynamic MOS self-reset logic and a dynamic MOS shift register latch by means of a timing circuit which does not allow the self-reset logic to be reset until the input clock pulse of the latch has arrived and the latch has had time to stably respond to valid input signals. Furthermore, in accordance with this invention, the timing incompatibility between the output of a dynamic MOS shift register latch and inputs of a dynamic MOS self-reset logic is solved by means of a DC to AC converter responsive to the output or launch clock pulse of the shift register latch logic. In accordance with one aspect of the invention, a chopper circuit responsive to the output clock (B-clock) of the latch generates a pulse which converts the steady state output levels of the latch to a pulsed format applied to the input terminals of the self-reset logic connected to the output terminals of the latch.

BRIEF DESCRIPTION OF THE DRAWING

An embodiment of the invention is described below with reference to the drawings in which.

DETAILED DESCRIPTION

Figure 2:
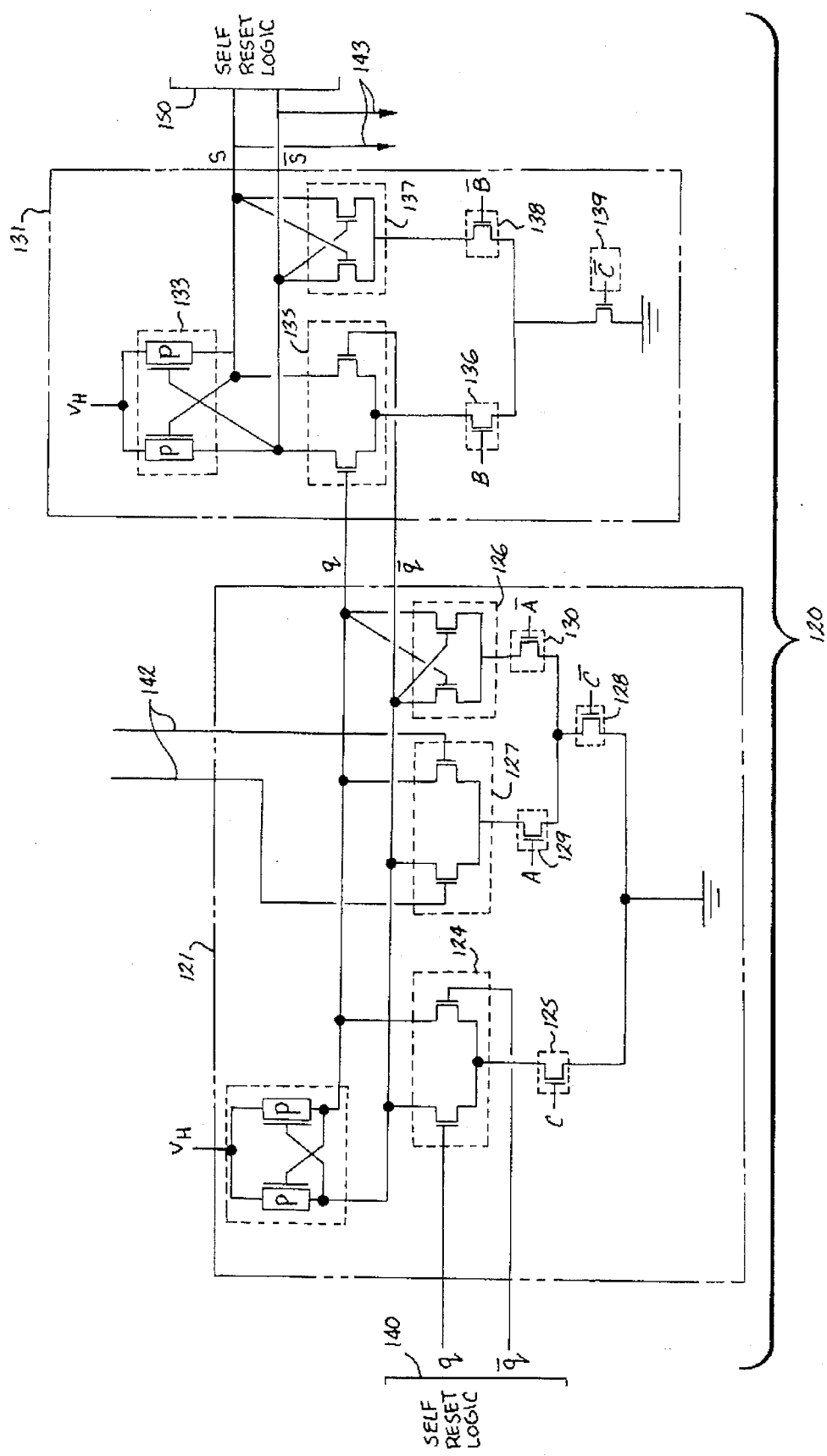
FIG. 2 is a circuit diagram representation of a prior art dual stage shift register latch.
Figure 3:
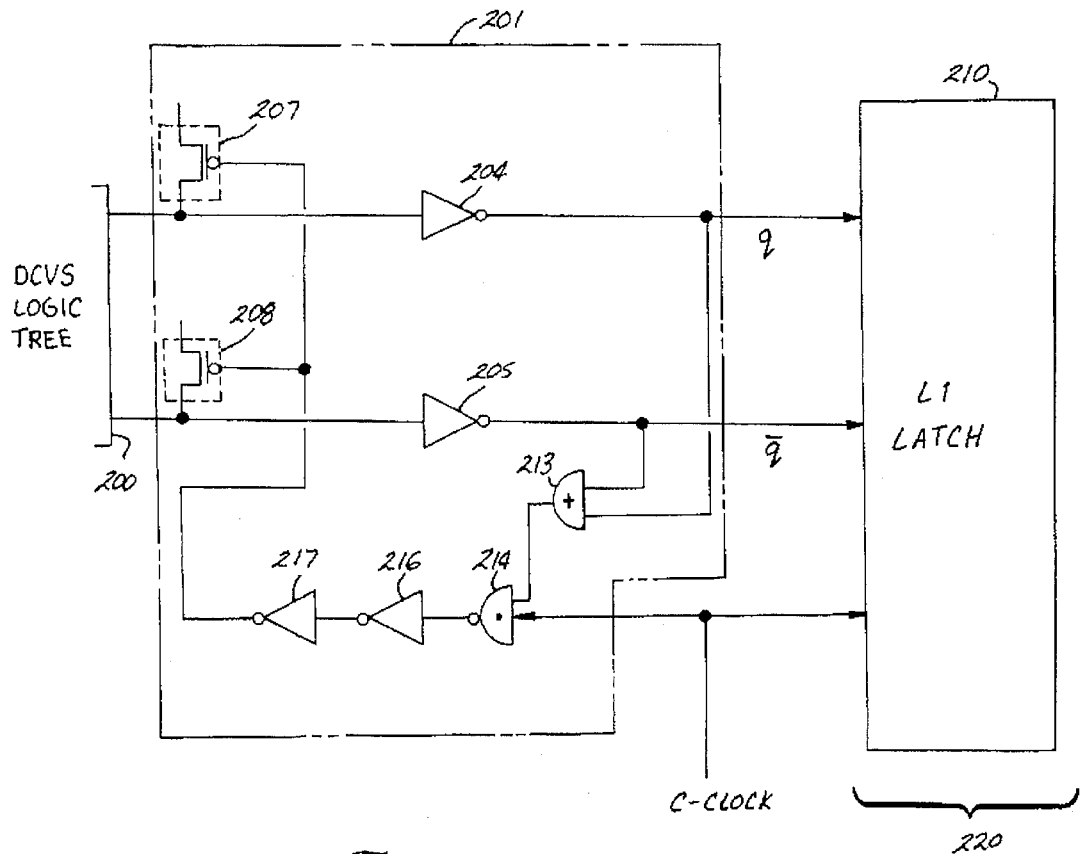
FIG. 3 is a circuit diagram representation of a reset circuit according to the invention.

FIG. 3 is a diagrammatic representation of an reset circuit 201 according to the invention for use with a dynamic MOS logic tree 200 having differential outputs x and x-bar. The reset circuit 201 has outputs q and q-bar which are connected as inputs to a first stage circuit 210 of a dynamic MOS shift register latch 220, which may be a latch such as latch 120 shown in FIG. 2. The circuit 201 includes a pair of inverters 204 and 205 having inputs connected to the outputs x and x-bar of a DCVS logic tree 200 which may be a DCVS logic tree such as logic tree 101 shown in FIG. 1. Circuit 201 provides outputs q and q-bar connected to the latch 210. PMOS circuits 207, 208 are connected to a voltage source $V_H$ and serve to charge the nodes x and x-bar of the logic tree 200 to high logic levels in response to a reset signal occurring on conductor 211. Since outputs q and q-bar are connected to nodes x and x-bar through inverters, outputs q and q-bar will be at a low logic level when nodes x and x-bar are charged.

The circuit 201 includes an OR-gate 213 having inputs connected to the outputs q and q-bar outputs of inverters 204 and 205, respectively, and having an output connected an input of a NAND-gate 214. Another input of the NAND-gate 214 is connected to the input clock signal, the C-clock pulse of latch 210. The C-clock pulse is operative to gate the outputs q and q-bar into the latch 210. Accordingly, the NAND-gate 214 generates a negative going output pulse when one of the outputs q and q-bar is high simultaneous with the occurrence of the C-clock pulse. The output of the NAND-gate 214 is connected to the input of a first of a chain of even number of serially connected inverters, e.g. 216, 217, with the output of the last one being connected to the conductor 211. The NAND-gate 214, together with the inverters 216 and 217 introduce a delay calculated to be greater the time required to latch the values of q and q-bar in latch 210. It will be apparent that a high output q or q-bar will result in a low pulse on conductor 211 in response to the input clock signal to the latch 120, causing nodes x and x-bar to be self-reset by PFETs 207, 208 in preparation for the next output from the logic tree 200. Thus, a charge pulse, returning the outputs x and x-bar to a high state is applied in response to the C-clock which gates the states of q and q-bar into the latch 210. The charge pulse is delayed from the clock by a period of time sufficient to guarantee that the states of q and q-bar are properly latched in the latch 210 before q and q-bar are returned to the quiescent low state.

Figure 1:
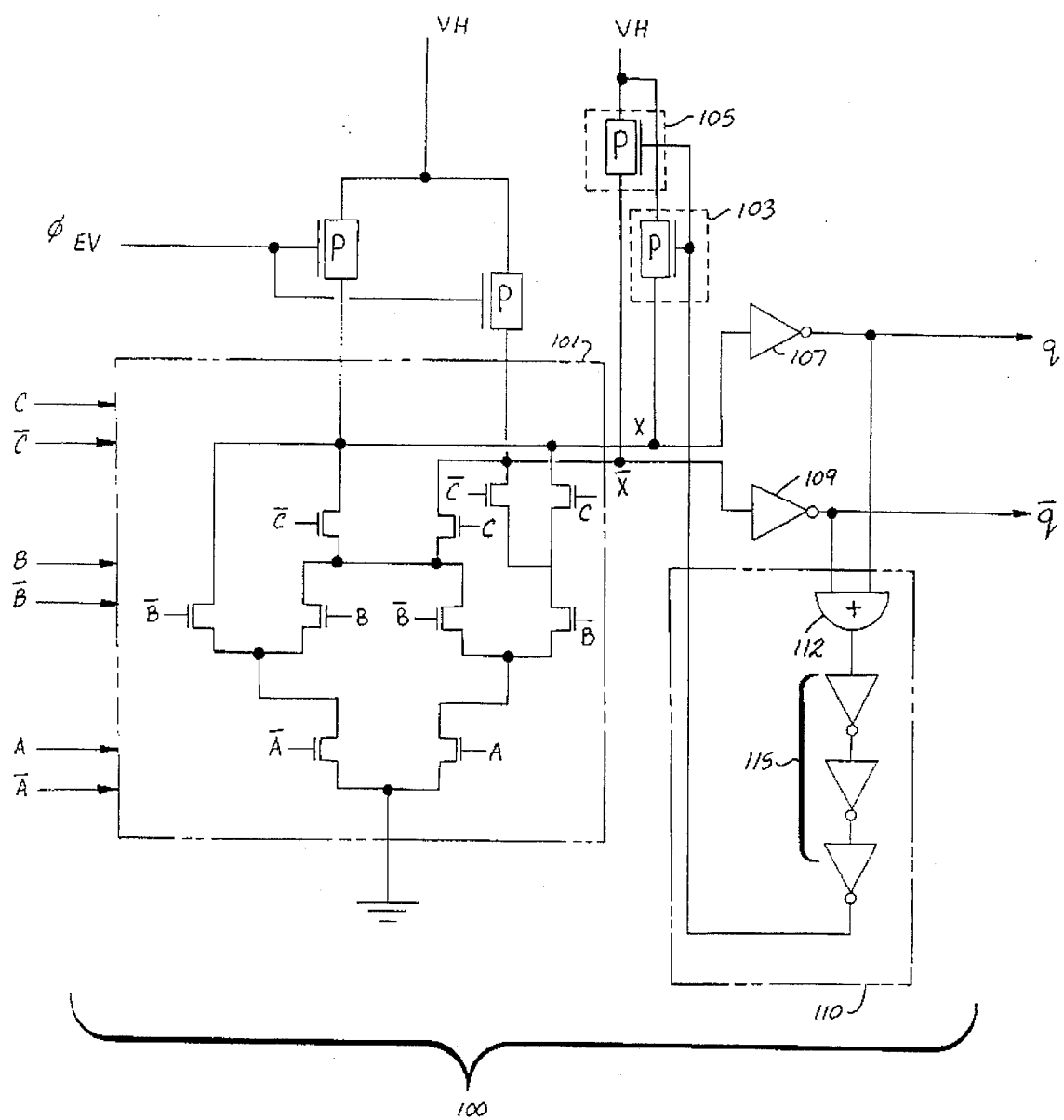
FIG. 1 is a circuit diagram representation of a prior art dual-ended self-reset logic circuit.
Figure 4:
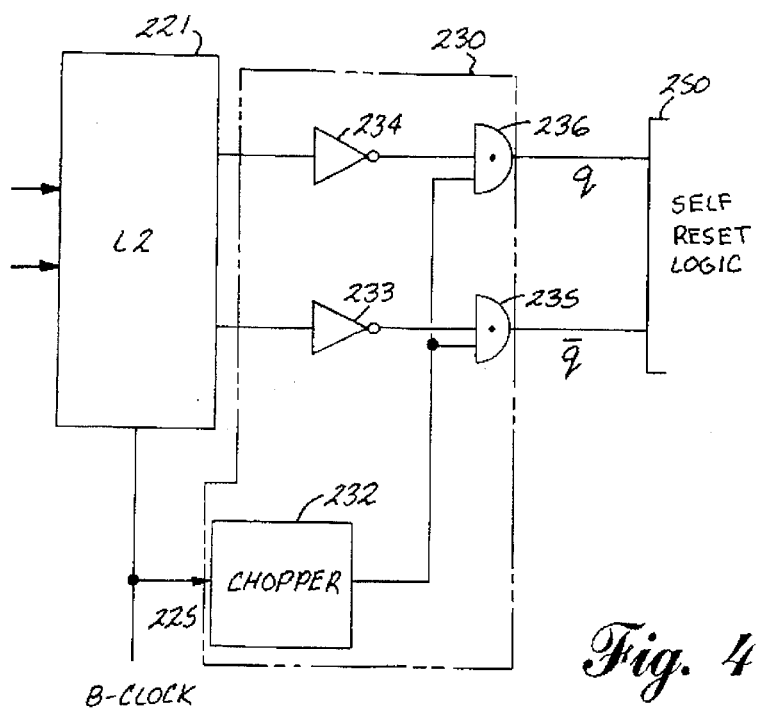
FIG. 4 is a diagrammatic representation of an interface circuit in accordance with the invention.

FIG. 4 is a diagrammatic representation of an interface circuit 230 connected between an output stage 221 of a dynamic MOS latch and inputs to a dynamic MOS self-reset logic circuit 250, which may be a DCVs logic tree circuit such as the logic circuit 100 shown in FIG. 1. The interface circuit 230 includes a chopper circuit 232 having an input connected to the launch clock (B-clock) which controls the activation of outputs s and s-bar of the output stage 221. The B-clock pulse starts after the C-clock pulse has terminated and terminates before the C-clock pulse arrives. The output s of the output stage 221 is connected via an inverter 233 to an AND gate 235. Similarly, output s-bar is connected via inverter 234 to an AND gate 236. AND gates 235 and 236 each have an input connected to conductor 240 which is connected to the output of the chopper circuit 232. AND gates 235 and 236 generate outputs q-bar and q, respectively, connected to the self-reset logic 250.

Figure 5:
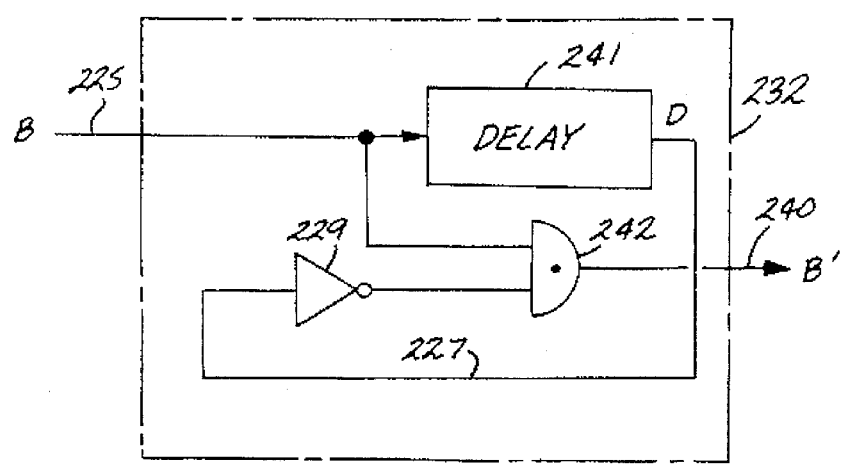
FIG. 5 is a diagrammatic representation of a pulse-generating circuit of FIG. 4.

The chopper circuit 232 is shown in greater detail in FIG. 5 and includes an AND gate 242 and a delay circuit 241. The chopper circuit 232 generates a pulse in response to the positive going edge of the B-clock pulse occurring on conductor 225. The pulse on conductor 225 is applied to the delay circuit 241 and to the AND gate 242. When a positive B-clock pulse occurs on conductor 225, AND gate 242 will produce a positive output pulse B'. The positive going edge of pulse B' is delayed from the pulse B-clock by the normal gate delay of AND gate 242. This delay is selected to be larger than the time required for the output stage 221 to produce stable outputs at the outputs of the inverters 233 and 234, in response to the B-clock pulse on conductor 225. This is to avoid a pulse on the conductor 240 connected to AND gates 235 and 236 before the output data has arrived at these gates. In the event that the AND gate 242 does not provide sufficient delay, an additional delay may be introduced in a standard fashion.

The delay circuit 241, which may be any well known and commercially available delay circuit, delays the B-clock pulse occurring on conductor 225 by a delay D and reproduces the delayed pulse D on conductor 227. This conductor is connected through an inverter 229 to an input of AND gate 242. It will be apparent that the positive going edge of the pulse B' will be generated in response to the occurrence of the B-clock pulse on conductor 225 and delayed by the gate delay of gate 242 via inverter 229. Furthermore, the pulse B' will terminate when the delayed pulse D, from delay circuit 241, on conductor 227 reaches the input of AND gate 242 via inverter 229.

Figure 6:
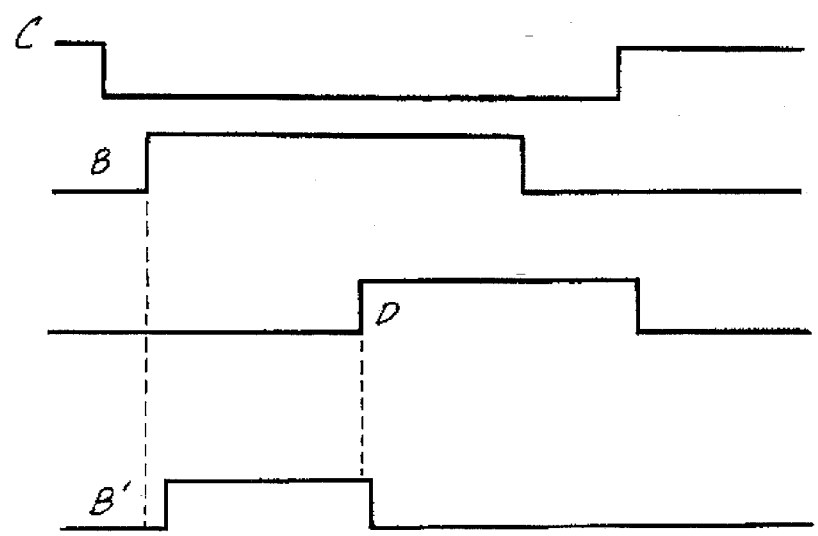
FIG. 6 is a timing diagram showing the relative timing of pulses in the circuit of FIGS. 4 and 5.

FIG. 6 is a timing chart showing the relative timing of clock pulses C and B and pulses B' and D. The C-clock pulse gates data into the first latch stage 210 (FIG. 3). The B-clock pulse occurs only when the output of the C-lock is low and launches the data to the output stage 221 of the latch. As can be seen from FIG. 6 and the circuitry of FIGS. 2 and 4, the output circuit 230 provides a clocked input to the dynamic MOS self-reset logic 250. The delay D introduced by the delay circuit 241 is selected to be such that the pulse B' is sufficiently wide for the self-reset logic 250 to be stabilized with respect to the new input. The interface circuit 230, in accordance with this invention, produces an output pulse of predefined duration which assures that the inputs to the self-reset logic are returned to a zero state on a timed basis in order to provide a pulsed input to the self-reset logic 250 from a latch providing a steady output.

Although the invention has been illustrated with respect to a differential cascode voltage switch latch, using tree-type MOS logic, it is to be understood that the invention has application with other types of latches as well. Furthermore, the latch 120 referenced in the above-noted example is a two-stage latch having scan-in inputs and scan-out outputs for testing purposes. A dynamic MOS latch without the test capability may be formed as a single stage latch controlled by the C-clock pulse and the C-bar clock pulse. In that configuration, the circuit 201 shown in FIG. 3 will be driven by the C-clock and the circuit 230 and FIG. 4 will be driven by the c-bar clock pulse. In an implementation without the test capabilities the A clock is not required.

Figure 7:
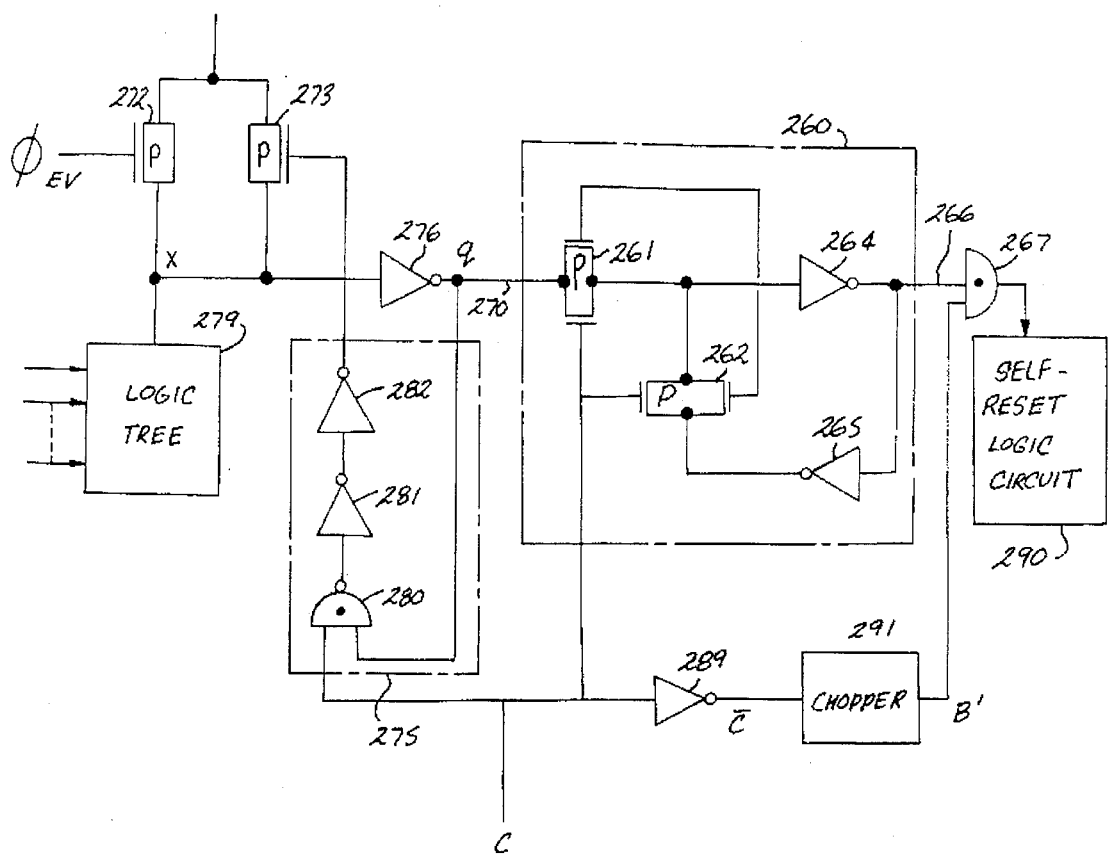
FIG. 7 is an alternate embodiment of the invention.

FIG. 7 depicts an application of the invention with a static MOS latch 260. The latch 260 represents a known latch circuit operated under control of complimentary clock pulses C and C-bar. The pulse C-bar may be generated from the C-clock pulse by inverter 289 or may be directly available from a clock circuit (not shown). When the C-clock lead is high, the clock lead C-bar is low and the gate 261 is turned on and the gate 262 is turned off, to gate the current input state into the latch. When the C-clock is low, the C-bar clock is high and gate 262 is turned on and gate 261 is turned off and the state of the input 270 will be maintained in latch 260 by the latching action of inverters 264 and 265.

The input 270 of latch 260 is connected to a single-ended dynamic MOS logic tree 279 which may be a DCVs logic tree such as logic tree 101 shown in FIG. 1 having a single output X. An inverter 276 provides a complemented output Q. Gate 272 supplies operating current during logic evaluation time from clocked input $\phi_{EV}$. Gate 273 provides charge current for the output node of the logic tree 279 during the self-reset time. A reset circuit 275 is connected to the Q output. The reset circuit includes NAND gate 280 followed by even numbers of inverters, such as inverters 281 and 282, and is connected to the charge gate 273. As in the circuit of FIG. 3, the NAND gate 280 is controlled by the C-clock which controls the latching of input data to the latch 260. When the C-clock goes to the high state, a reset signal is generated at NAND gate 280 if the Q output is high. The reset signal is delayed by the gate delays of NAND gate 280 and inverters 281 and 282 to activate charge gate 273 a predetermined period of time after the leading edge of the C-clock pulse. Without the C-clock input the reset signal may occur before the output state of the logic tree 279 has been properly gated into the latch 260. The time delay introduced by the combination of inverters 276, 281 and 282 and NAND gate 280 should be greater than the duration of the C-clock pulse. Otherwise, latch 260 will be reset unconditionally as self-reset logic 275 is reset.

The output 266 of the latch 260 is connected via an AND gate 267 to a single input self-reset logic circuit 290, which may be of the type generally shown in FIG. 1 having single rather than differential input. The AND gate 267 is controlled from a chopper circuit 291 which is identical in structure to the circuit 232 shown in FIG. 5. In the circuit of FIG. 4, the B-clock pulse was used as an input to the chopper circuit. However, the static latch 260 does not use a B-clock pulse. In the single input embodiment shown in FIG. 7, the chopper circuit 291 is operated under control of the C-bar clock pulse, which is the compliment of the C-clock pulse. The C-bar dock pulse, like B-clock pulse, occurs after termination of the C-clock pulse. This assures that the data has been properly latched in the latch 260. The clock pulse B' is generated from the C-bar clock pulse a period of time after termination of the C-clock which is at least equal to one gate delay such as introduced by the gate 242 shown in FIG. 5. As shown in FIG. 5, the pulse B' is terminated a period of time determined by the delay introduced by the delay circuit 241 and gate delays of inverter 229 and gate 242. In this manner, the steady state output of a static latch is presented to dynamic MOS logic on a pulsed basis.

It is to be understood that the above-described arrangements are merely illustrative of the application of the principles of the invention and that other arrangements may be devised by those skilled in the art without departing from the scope of the invention as defined by the accompanying claims.

What is claimed is:

1. A method of controlling transfer of signals from a first self-resetting logic circuit to a second self-resetting logic circuit requiring a pulsed input, the method comprising the steps of:

transferring an output signal from the first logic circuit to a latch and registering the output signal in the latch under control of a clock pulse having a leading edge and a trailing edge and generating a latch output signal;

resetting the first logic circuit a predetermined period of time after the clock pulse leading edge;

in response to the trailing edge of the clock pulse, generating a latch output control pulse; and transferring the latch output signal to the second logic circuit on a pulsed basis in response to the latch output control pulse.

2. The method in accordance with claim 1 wherein the step of generating the latch output control pulse comprises generating a latch output pulse having a leading edge delayed from the trailing edge of the clock pulse by a first predetermined period of time and a trailing edge delayed from the trailing edge of the clock pulse by a second predetermined period of time longer than the first predetermined period of time.

* * * * *